(12) United States Patent
Park et al.

(10) Patent No.: US 6,461,910 B1
(45) Date of Patent: Oct. 8, 2002

(54) METHOD OF FORMING A CAPACITOR IN A SEMICONDUCTOR DEVICE

(75) Inventors: Dong Su Park, Ichon-shi (KR); Kwang Seok Jeon, Ichon-shi (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 0 days.

(21) Appl. No.: 09/708,063

(22) Filed: Nov. 8, 2000

(30) Foreign Application Priority Data

Nov. 9, 1999 (KR) .................................. 99-49501

(51) Int. Cl.$^7$ .......................................... H01L 21/8242
(52) U.S. Cl. ...................... 438/240; 438/238; 438/239; 438/381
(58) Field of Search ................................ 438/238, 239, 438/240, 381

(56) References Cited

U.S. PATENT DOCUMENTS

| | | | |
|---|---|---|---|
| 4,397,077 A | 8/1983 | Derbenwick et al. | 438/251 |
| 4,895,520 A | 1/1990 | Berg | 438/289 |
| 5,106,776 A | 4/1992 | Shen et al. | 438/248 |
| 5,219,778 A | 6/1993 | Dennison et al. | 438/254 |
| 5,298,436 A | 3/1994 | Radosevich et al. | 438/396 |
| 5,300,450 A | 4/1994 | Shen et al. | 438/243 |
| 5,405,796 A | 4/1995 | Jones, Jr. | 438/3 |
| 5,716,875 A | 2/1998 | Jones, Jr. et al. | 438/3 |
| 5,907,780 A | 5/1999 | Gilmer et al. | 438/299 |
| 5,923,056 A | 7/1999 | Lee et al. | 257/192 |
| 5,960,270 A | 9/1999 | Misra et al. | 373/107 |
| 6,010,927 A | 1/2000 | Jones, Jr. et al. | 438/210 |
| 6,066,525 A | 5/2000 | Liu et al. | 438/241 |
| 6,103,566 A | * 8/2000 | Tamaru et al. | 438/240 |
| 6,200,844 B1 | * 3/2001 | Huang | 438/238 |
| 6,319,843 B1 | * 11/2001 | Lyons | 438/724 |

FOREIGN PATENT DOCUMENTS

JP 62-204567 9/1987

* cited by examiner

*Primary Examiner*—Long Pham
(74) *Attorney, Agent, or Firm*—Finnegan, Henderson, Farabow, Garrett, & Dunner, L.L.P.

(57) ABSTRACT

The present invention relates to a method of manufacturing a capacitor in a semiconductor device capable of improving the leak current characteristic while preventing degradation of a dielectric characteristic of a $Ta_2O_5$ capacitor. The present invention includes forming a $Ta_2O_5$ dielectric film on a lower electrode and then forming a TaN upper electrode on the $Ta_2O_5$ dielectric film using a $H_2TaF_7$ reactive source gas or a $NH_3$ gas. Thus, the present invention can improve the leak current characteristic since the TaN thin film has a large work function than the TiN thin film used as the conventional upper electrode. Also, as the $H_2TaF_7$ gas used in the present invention can be used as the source gas for depositing the $Ta_2O_3$ dielectric film, the $Ta_2O_5$ dielectric film and the TaN upper electrode can be simultaneously formed in in-situ at the same chamber.

27 Claims, 1 Drawing Sheet

METHOD OF FORMING A CAPACITOR IN A SEMICONDUCTOR DEVICE

BACKGROUND OF THE INVENTION

1. Field of the Invention

The invention relates generally to a method of manufacturing a capacitor in a semiconductor device. More particularly, it relates to a method of manufacturing a capacitor in a semiconductor device capable of improving the leak current characteristic while preventing degradation of a dielectric characteristic of a $Ta_2O_5$ capacitor.

2. Description of the Prior Art

Generally, the $Ta_2O_5$ capacitor is manufactured in a MIS (Metal-Insulator-Silicon) structure in which a TiN film/polysilicon film structure is stacked as an upper electrode. The reason why the stacked TiN film/polysilicon film is used, is that it can improve the leak current characteristic of the TiN film since it has the value of a higher work function compared with the polysilicon film.

However, there are the following problems when using the TiN film as the upper electrode. That is, the process of forming a CVD TiN film using a mixed gas of $TiCl_4+NH_3$ will increase the leak current in the $Ta_2O_5$ dielectric film due to a halogen gas. Also, there will happen an interface reaction between the $Ta_2O_5$ dielectric film and the TiN film at the temperature of about 500° C., thus causing oxygen within the $Ta_2O_5$ dielectric film to flow into the TiN film. Thus, oxygen vacancy will be created within the $Ta_2O_5$ dielectric film, resulting in increase of the leak current. The reaction between the $Ta_2O_5$ dielectric film and the TiN film can be expressed into the following chemical equation. The $TiO_2$ film formed by this chemical reaction will degrade the capacitor characteristic of the $TiO_2$ film.

$$5TiN + 2Ta_2O_5 \rightarrow TiO_2 + 4TaN + 1/2N_2 \quad \text{[Equation 1]}$$

SUMMARY OF THE INVENTION

It is therefore an object of the present invention to provide a method of manufacturing a capacitor in a semiconductor device by which TaN is used as an upper electrode, which can improve the leak current characteristic of a $Ta_2O_5$ capacitor due to the high work function of a TaN while preventing degradation of the dielectric characteristic of the $Ta_2O_5$ capacitor, in order to prevent degradation of the dielectric characteristic due to the interface reaction between a $Ta_2O_5$ dielectric film and a TiN upper electrode in the $Ta_2O_5$ capacitor.

In order to accomplish the above object, a method of manufacturing a capacitor in a semiconductor device according to the present invention is characterized in that it comprises the steps of forming a lower electrode on a semiconductor substrate in which various components for forming a semiconductor device are formed, forming a $Ta_2O_5$ dielectric film on said lower electrode; and forming an upper electrode made of a TaN film on said $Ta_2O_5$ dielectric film.

BRIEF DESCRIPTION OF THE DRAWINGS

The aforementioned aspects and other features of the present invention will be explained in the following description, taken in conjunction with the accompanying drawings, wherein.

DETAILED DESCRIPTION OF PREFERRED EMBODIMENTS

Figure 1A:
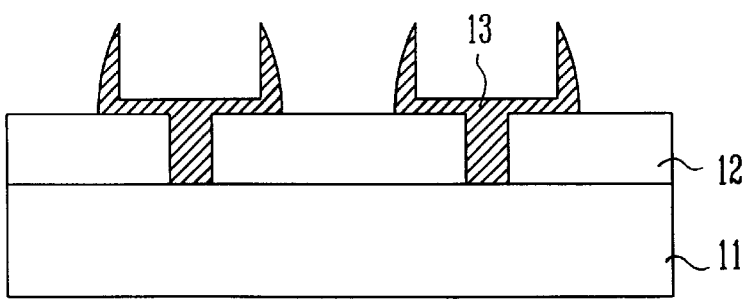
FIGS. 1A to 1D are cross-sectional views for illustrating a method of manufacturing a capacitor in a semiconductor device according to the present invention.

The present invention will be described in detail by way of a preferred embodiment with reference to accompanying drawings, in which like reference numerals are used to identify the same or similar parts.

FIGS. 1A to 1D are cross-sectional views for illustrating a method of manufacturing a capacitor in a semiconductor device according to the present invention.

Referring now to FIG. 1A, an interlayer insulating film 12 is formed on a semiconductor substrate 11 in which various components (not shown) for forming a semiconductor device are formed, on which a lower electrode 13 is then formed.

In the above, the lower electrode 13 is may be formed of silicon series material such as doped polysilicon, doped amorphous silicon, etc. or metal materials such as TiN, TaN, W, WN, WSi, Ru, $RuO_2$, Ir, $IrO_2$, Pt, etc. Also, the lower electrode 13 may be formed in various 3-dimensional structures such as a double and triple structure of a simple stacked structure or a cylinder structure as shown in the drawing in order to increase the effective surface area. Further, it may add a semicircle type polysilicon layer to increase the effective surface area.

Figure 1B:
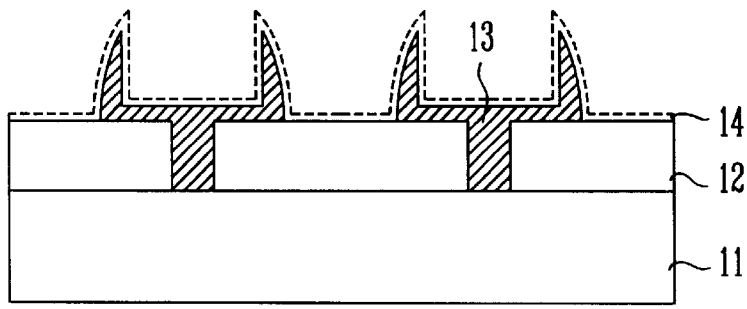

Referring to FIG. 1B, the surface of the lower electrode 13 is nitrified to form a thin nitride film 14.

In the above, the nitride film 14 acts to prevent generating a low dielectric native oxide film ($SiO_2$) at the interface between the dielectric film and the lower electrode 13 when the dielectric film of the capacitor is formed or by a subsequent thermal process. At this time, the nitride film 14 is formed by discharging plasma at the temperature of 200~600° C. in in-situ or ex-situ state and then nitrifying under $NH_3$ gas, $N_2/H_2$ gas or $N_2O$ gas atmosphere, before the dielectric film is formed at the low-pressure chemical vapor deposition (LPCVD) chamber. In stead of nitrifying the nitride film 14 using plasma, the nitride film 14 may be formed by annealing at the temperature of 650~950° C. under $NH_3$ gas atmosphere using a rapid thermal process (RTP) or may be formed at the temperature of 650~950° C. under $NH_3$ gas atmosphere using a furnace.

Figure 1C:
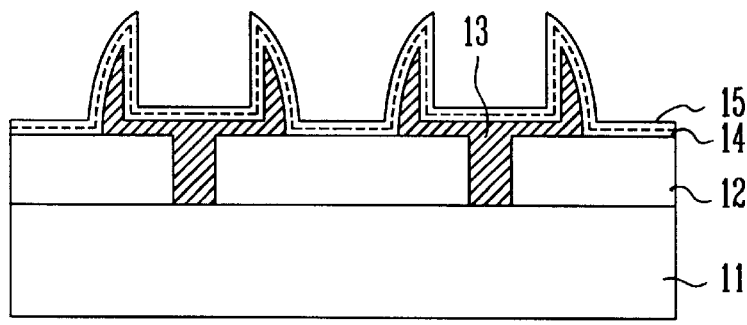

Referring now to FIG. 1C, a $Ta_2O_5$ dielectric film 15 is formed on the entire surface on which the nitride film 14 is formed.

In the above, a method of forming the $Ta_2O_5$ dielectric film 15 is as follows. First, it supplies a given amount of Ta compound vapor gas and $O_2$ gas (10~100 sccm) of a reactive gas via a flow controller such as a MFC (Mass Flow Controller), forms a $Ta_2O_5$ thin film of an amorphous state in thickness of 50~150 Å by a surface chemical reaction occurring on the wafer and then performs thermal process and high temperature thermal process, in the LPCVD chamber having the temperature of 300~600° C. and the pressure of 10 torr or less.

The Ta compound vapor gas may be created by supplying a given amount of a $Ta(OC_2H_5)_5$ solution of 99.999% or more with the vaporizer or the vaporizing tube having the temperature of 150~200° C. using a flow controller such as the MFC. At this time, the supply tube becoming the flow pate of Ta vapor as well as the vaporizer including the orifice or the nozzle must be always kept at the temperature of 150~200° C. in order to prevent condensation of Ta vapor.

The low temperature thermal process, which is performed after the $Ta_2O_5$ thin film of an amorphous state is formed, is performed at the temperature of 200~600° C. under $N_2O$ or $O_2$ atmosphere using plasma, so that oxygen vacancy and carbon impurity remaining in the substitution type Ta atoms within the $Ta_2O_5$ thin film of an amorphous state can be oxidized to remove the cause of leak current generation. The low temperature thermal process may be performed at the temperature of 300~500° C. using $UV/O_3$.

The high thermal process, which is performed after the low temperature thermal process, is performed at the temperatures of 650~950° C. under $N_2O$, $O_2$ or $N_2$ gas atmosphere using the furnace or RTP. This will remove volatile carbon compound remaining within the $Ta_2O_5$ thin film of an amorphous state even after the low-temperature thermal process to prevent generation of the leak current and also will induce crystallization of the $Ta_2O_5$ thin film to increase the dielectric constant. The high-temperature thermal process may be performed after the $Ta_2O_5$ thin film of an amorphous state is deposited or may be formed after the upper electrode is formed.

Figure 1D:
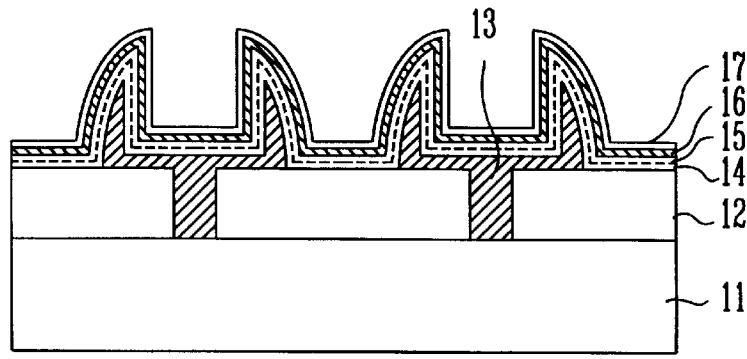

Referring now to FIG. 1D, a TaN film 16 and a polysilicon film 17 are sequentially formed on the $Ta_2O_5$ thin film 15 to thus form an upper electrode.

In the above, the TaN film 16 is formed by supplying a Ta compound gas or a $NH_3$ gas of a reactive gas at the flow rate of 10~1000 sccm so that the surface reaction can be generated at the LPCVD chamber having the temperature of 650~950° C. At this time, in order to improve the reactivity, the plasma may be excited.

The Ta compound vapor gas may be obtained by supplying $H_2TaF_7$ with the vaporizer or the vaporizing tube through the flow controller such as the LMFC (liquid mass flow controller) in the LPCVD chamber having the temperature of 300~600° C. and then vaporizing a given amount of it at the temperature of 120~200° C.

Meanwhile, in the mentioned embodiment of the present invention, a $O_2$ gas is used as a reactive source gas when the $Ta_2O_5$ thin film is formed, other gases such as $H_2TaF_7$ or $O_2$ gas may be also used. In case that the $H_2TaF_7$ or $O_2$ gas are used as the reactive source gas, as carbon does not exist within the reactive source gas and the TaN film 16 is used as the upper electrode, oxygen within the $Ta_2O_5$ thin film will not react with the TaN film. Thus, the low-temperature thermal process can be omitted since the oxygen vacancy will not be formed. Also, the high-temperature thermal process can be performed after the TaN film 16 is deposited in in-situ, thus inducing crystallization of the $Ta_2O_5$ thin film of an amorphous state.

As can be understood from the above description, the present invention can improve the leak current characteristic since the TaN thin film has a large work function than the TiN thin film used as the conventional upper electrode in the $Ta_2O_5$ capacitor. Also, it can prevent degradation of the dielectric characteristic since there is no interface reaction between the $Ta_2O_5$ dielectric film and the TaN upper electrode. Further, as the $H_2TaF_7$ gas used in the present invention can be used as the source gas for depositing the $Ta_2O_3$ dielectric film, the $Ta_2O_5$ dielectric film and the TaN upper electrode can be simultaneously formed at the same time. Thus, it can save the processing time and reduces the cost of new TaN deposition equipment.

The present invention has been described with reference to a particular embodiment in connection with a particular application. Those having ordinary skill in the art and access to the teachings of the present invention will recognize additional modifications and applications within the scope thereof.

It is therefore intended by the appended claims to cover any and all such applications, modifications, and embodiments within the scope of the present invention.

What is claimed is:

1. A method of forming a capacitor in a semiconductor device, comprising the steps of:
   forming a lower electrode over at least a portion of a semiconductor substrate;
   forming a Ta2O5 dielectric film over at least a portion of said lower electrode;
   performing a low temperature thermal process so that oxygen vacancy and carbon impurity remaining in the substitution type Ta atoms within the $Ta_2O_5$ film are oxidized;
   performing a high thermal process to remove a volatile carbon compound remaining within $Ta_2O_5$ film; and
   forming an upper electrode comprising a TaN film over at least a portion of said $Ta_2O_5$ dielectric film.

2. The method of forming a capacitor in a semiconductor device according to claim 1, wherein said lower electrode includes silicon series material comprising one or more of doped polysilicon and doped amorphous silicon or metal materials comprising one or more of TiN, TaN, W, WN, WSi, Ru, $RuO_2$, Ir, $IrO_2$, and Pt.

3. The method of forming a capacitor in a semiconductor device according to claim 1, further comprising the step of forming a nitride film by nitrifying a surface of said lower electrode before forming said $Ta_2O_5$ dielectric film.

4. The method of forming a capacitor in a semiconductor device according to claim 3, wherein said step of forming a nitride film includes forming by discharging plasma under a $NH_3$ gas, a $N_2/H_2$ gas or a $N_2O$ gas atmosphere in a low-pressure chemical vapor deposition chamber.

5. The method of forming a capacitor in a semiconductor device according to claim 3, wherein said step of forming a nitride film includes forming by using a rapid thermal process or a furnace at a temperature of 650~950° C. under a $NH_3$ gas atmosphere.

6. The method of forming a capacitor in a semiconductor device according to claim 1, wherein said step of forming a $Ta_2O_5$ dielectric film includes forming by supplying a given amount of Ta compound gas vapor and a $O_2$ containing a reactive gas through a flow controller, forming a $Ta_2O_3$ thin film of an amorphous state through a surface chemical reaction occurring on a wafer and then performing a low-temperature thermal process and a high temperature thermal process in a low-pressure chemical vapor deposition chamber having a temperature of 300~600° C.

7. The method of forming a capacitor in a semiconductor device according to claim 6, wherein said step of forming a $Ta_2O_5$ dielectric film includes producing said Ta compound gas vapor by supplying a given amount of a $Ta(OC_2H_5)_5$ solution with a vaporizer or a vaporizing tube having a temperature of 150~200° C. by a flow controller.

8. The method of forming a capacitor in a semiconductor device according to claim 6, wherein said performing a low-temperature thermal process includes performing at a temperature of 200~600° C. under a $N_2O$ or $O_2$ atmosphere using plasma.

9. The method of forming a capacitor in a semiconductor device according to claim 6, wherein said performing a low-temperature thermal process includes performing at a temperature of 300~500° C. using $UV/O_3$.

10. The method of forming a capacitor in a semiconductor device according to claim 6, wherein said step of performing a high-temperature thermal process includes performing at a temperature of 650~950° C. under a $N_2O$, $O_2$ or $N_2$ gas atmosphere using a furnace or a rapid thermal process.

11. The method of forming a capacitor in a semiconductor device according to claim 1, wherein said step of forming an upper electrode includes forming by stacking a doped polysilicon over said TaN film.

12. The method of forming a capacitor in a semiconductor device according to claim 1, wherein said step of forming an upper electrode having a TaN film includes forming by surface-reacting within a low-pressure chemical vapor deposition chamber having a temperature of 300~600° C. using a Ta compound vapor gas or a $NH_3$ gas being a reactive gas.

13. The method of forming a capacitor in a semiconductor device according to claim 12, wherein said step of forming a $Ta_2O_5$ dielectric film includes producing TaN compound vapor gas by supplying $H_2TaF_7$ with a vaporizer or a vaporizing tube through a flow controller in a low-pressure chemical vapor deposition chamber having a temperature of 300~600° C. and then vaporizing a given amount of the $H_2TaF_7$ at a temperature of 120~200° C.

14. The method of forming a capacitor in a semiconductor device according to claim 1, wherein said step of forming a $Ta_2O_5$ dielectric film includes forming by first forming a $Ta_2O_5$ thin film of an amorphous state using $H_2TaF_7$ or $O_2$ gas as reactive gases, depositing the TaN film in in-situ and then performing a high-temperature thermal process to induce crystallization of said $Ta_2O_5$ dielectric film.

15. A method of forming a capacitor in a semiconductor device, comprising the steps of:

forming a lower electrode over at least a portion of a semiconductor substrate;

forming a $Ta_2O_5$ dielectric film over at least a portion of said lower electrode; and forming an upper electrode comprising a TaN film over at least a portion of said $Ta_2O_5$ dielectric film;

wherein said step of forming a $Ta_2O_5$ dielectric film includes forming by supplying a given amount of Ta compound gas vapor and an $O_2$ containing a reactive gas through a flow controller, forming a $Ta_2O_5$ thin film of an amorphous state through a surface chemical reaction occurring on a wafer and then performing a low-temperature thermal process and a high temperature thermal process in a low-pressure chemical vapor deposition chamber having a temperature of 300–600° C.

16. The method of forming a capacitor in a semiconductor device according to claim 15, wherein said lower electrode includes silicon series material comprising one or more doped polysilicon and doped amorphous silicon or metal materials comprising one or more TiN, TaN, W, WN, WSi, Ru, $RuO_2$, Ir, $IrO_2$, and Pt.

17. The method of forming a capacitor in a semiconductor device according to claim 15, further comprising the step of forming a nitride film b nitrifying a surface of said lower electrode before forming said $Ta_2O_5$ dielectric film.

18. The method of forming a capacitor in a semiconductor device according to claim 17, wherein said step of forming a nitride film includes forming by discharging plasma under a $NH_3$ gas, a $N_2/H_2$ gas or a $N_2O$ gas atmosphere in a low-pressure chemical vapor deposition chamber.

19. The method of forming a capacitor in a semiconductor device according to claim 17, wherein said step of forming a nitride film includes forming by using a rapid thermal process or a furnace at a temperature of 650~950° C. under a $NH_3$ gas atmosphere.

20. The method of forming a capacitor in a semiconductor device according to claim 15, wherein said step of forming a $Ta_2O_5$ dielectric film includes producing said Ta compound gas vapor by supplying a given amount of a $Ta(OC_2H_5)_5$ solution with a vaporizer or a vaporizing tube having a temperature of 150~200° C. by a flow controller.

21. The method of forming a capacitor in a semiconductor device according to claim 15, wherein said step of performing a low temperature thermal process includes performing at a temperature of 200~600° C. under a $N_2O$ or $O_2$ atmosphere using plasma.

22. The method of forming a capacitor in a semiconductor device according to claim 15, wherein said step of performing a low-temperature thermal process includes performing at a temperature of 300~500° C. using $UV/O_3$.

23. The method of forming a capacitor in a semiconductor device according to claim 15, wherein said step of performing a high-temperature thermal process includes performing at a temperature of 650~950° C. under a $N_2O$, $O_2$ or $N_2$ gas atmosphere using a furnace or a rapid thermal process.

24. The method of forming a capacitor in a semiconductor device according to claim 15, wherein said step of forming an upper electrode includes forming by stacking a doped polysilicon over said TaN film.

25. The method of forming a capacitor in a semiconductor device according to claim 1, wherein said step of forming an upper electrode having a TaN film including forming by surface-reacting within a low-pressure chemical vapor deposition chamber having a temperature of 300~600° C. using a Ta compound vapor gas or a $NH_3$ gas being a reactive gas.

26. The method of forming a capacitor in a semiconductor device according to claim 24, wherein said step of forming a $Ta_2O_5$ dielectric film includes producing a TaN compound vapor gas by supplying $H_2TaF_7$ with a vaporizer or a vaporizing tube through a flow controller in a low-pressure chemical vapor deposition chamber having a temperature of 300~600° C. and then vaporizing a given amount of the $H_2TaF_7$ at a temperature of 120~200° C.

27. The method of forming a capacitor in a semiconductor device according to claim 15, wherein said step of forming a $Ta_2O_5$ dielectric film includes forming by first forming a $Ta_2O_5$ thin film of an amorphous state using $H_2TaF_7$ or $O_2$ gas as reactive gases, depositing the TaN film in in-situ and then performing a high-temperature thermal process to induce crystallization of said $Ta_2O_5$ dielectric film.

* * * * *

UNITED STATES PATENT AND TRADEMARK OFFICE
CERTIFICATE OF CORRECTION

PATENT NO. : 6,461,910 B1  Page 1 of 1
DATED : October 8, 2002
INVENTOR(S) : Dong Su Park et al.

It is certified that error appears in the above-identified patent and that said Letters Patent is hereby corrected as shown below:

Column 4,
Line 6, "$Ta_2O5$" should read -- $Ta_2O_5$ --.

Column 5,
Line 51, "b nitrifying" should read -- by nitrifying --.

Column 6,
Line 1, "$N_2/H_2gas$" should read -- $N_2/H_2$ gas --.
Line 35, "including forming" should read -- includes forming --.

Signed and Sealed this

Sixteenth Day of March, 2004

JON W. DUDAS
*Acting Director of the United States Patent and Trademark Office*